(12) United States Patent
Okayama

(10) Patent No.: US 7,982,270 B2
(45) Date of Patent: *Jul. 19, 2011

(54) SEMICONDUCTOR DEVICE INCLUDING MEMORY CELL AND ANTI-FUSE ELEMENT

(75) Inventor: Yasunori Okayama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/554,516

(22) Filed: Sep. 4, 2009

(65) Prior Publication Data

US 2009/0321790 A1  Dec. 31, 2009

Related U.S. Application Data

(60) Continuation of application No. 11/848,382, filed on Aug. 31, 2007, now Pat. No. 7,601,564, which is a division of application No. 11/052,803, filed on Feb. 9, 2005, now Pat. No. 7,329,911.

(30) Foreign Application Priority Data

Feb. 10, 2004 (JP) .................................. 2004-033339
Feb. 10, 2005 (JP) .................................. 2005-034472

(51) Int. Cl.
*H01L 27/092* (2006.01)
(52) U.S. Cl. ................................ 257/369; 257/E27.062
(58) Field of Classification Search .......... 257/314–316, 257/369, E27.062
See application file for complete search history.

(56) References Cited

U.S. PATENT DOCUMENTS

| 4,543,594 | A | 9/1985 | Mohsen et al. |
| 6,307,236 | B1 * | 10/2001 | Matsuzaki et al. ............ 257/392 |
| 6,452,248 | B1 | 9/2002 | Le |
| 6,717,267 | B1 * | 4/2004 | Kunikiyo ...................... 257/758 |
| 6,753,590 | B2 | 6/2004 | Fifield et al. |
| 6,774,439 | B2 | 8/2004 | Fukuzumi et al. |
| 2002/0117724 | A1 | 8/2002 | Ariyoshi et al. |

FOREIGN PATENT DOCUMENTS

| JP | 2001-308283 | 11/2001 |
| JP | 2002-134620 | 5/2002 |
| JP | 2003-86768 | 3/2003 |
| JP | 2003-115537 | 4/2003 |

OTHER PUBLICATIONS

Yasuhiro Fukaura, et al., "A Highly Manufacturable High Density embedded SRAM Technology for 90nm CMOS", IEDM 2002, pp. 415-418.

* cited by examiner

*Primary Examiner* — Nathan W Ha
(74) *Attorney, Agent, or Firm* — Oblon, Spivak, McClelland, Maier & Neustadt, L.L.P.

(57) ABSTRACT

A semiconductor device includes an anti-fuse portion and a memory cell portion each including a MOSFET structure having a gate insulating film formed on a semiconductor substrate and a gate electrode formed on the gate insulating film; wherein a depletion ratio in the gate electrode of the anti-fuse portion is different from the depletion ratio in the gate electrode of the memory cell portion, and the depletion ratio in the gate electrode of the anti-fuse portion is lower than the depletion ratio in the gate electrode of the memory cell portion.

20 Claims, 5 Drawing Sheets

SEMICONDUCTOR DEVICE INCLUDING MEMORY CELL AND ANTI-FUSE ELEMENT

CROSS REFERENCE TO RELATED APPLICATIONS

This application is a continuation of U.S. application Ser. No. 11/848,382 filed Aug. 31, 2007, which is a divisional of U.S. application Ser. No. 11/052,803 filed Feb. 9, 2005, and claims benefit of priority under 35 USC §119 to Japanese Patent Application No. 2004-033339 filed on Feb. 10, 2004, and Patent Application No. 2005-034472 filed Feb. 10, 2005, the entire contents of each of which are incorporated by reference.

BACKGROUND OF THE INVENTION

The present invention relates to a semiconductor device including a memory cell and anti-fuse element, particularly to a semiconductor device including a memory cell and anti-fuse element having a gate capacitor of a metal oxide semiconductor field effect transistor (hereinafter abbreviated as MOSFET) type.

In recent years, electric fuse (e-Fuse) elements which can be remedied even after package sealing of semiconductor elements have attracted attentions as elements which are to replace metal fuse elements broadly used in redundancy circuits having redundancy.

In a gate insulation breakdown type which is one of the electric fuse elements, a system in which high electric field is applied to a gate to break down an oxide insulation film is used, a current flows at a programming time, and any current does not flow at an un-programming time.

Therefore, to achieve a function of a fuse, it is necessary to enlarge a difference between leak currents before/after breaking down a gate insulating film for the programming.

Among the gate insulation breakdown type electric fuses (e-Fuses), a gate insulation breakdown type electric fuse (e-Fuse) having a MOSFET structure which can be formed in the same steps as those for a MOSFET element has a very large merit from a viewpoint of a step cost. However, in recent years, with miniaturization, the gate insulating film has been thinned. Even before the programming, much leak current flows.

Therefore, there is a problem that it is difficult to secure the difference between the leak currents before/after the programming.

As patent documents prior to the present application, there are Japanese Patent Application Laid-Open Nos. 2001-308283 and 2003-86768.

As described above, in the anti-fuse element comprising the conventional MOSFET structure, the gate insulating film to be broken at the programming time has been thinned with the miniaturization in recent years. Therefore, there has been a problem that much leak current flows even before the programming, it is difficult to secure the difference of the leak current before/after the programming, and sufficient stability cannot be secured from viewpoints of programming characteristic and reliability.

In this technical field, there has been a demand for a semiconductor device including a memory cell and anti-fuse element having satisfactory programming properties and high reliability, in which electric resistance properties of the gate insulating film of an anti-fuse portion before programming is strengthened without increasing the steps, and accordingly a current difference before/after the programming is easily secured.

SUMMARY OF THE INVENTION

A first aspect of the present invention is directed to a semiconductor device comprising an anti-fuse portion and a memory cell portion each including a MOSFET structure having a gate insulating film formed on a semiconductor substrate, and a gate electrode formed on the gate insulating film, wherein a depletion ratio in a gate electrode of the anti-fuse portion is different from a depletion ratio in a gate electrode of the memory cell portion, and the depletion ratio in the gate electrode of the anti-fuse portion is lower than the depletion ratio in the gate electrode of the memory cell portion.

A second aspect of the present invention is directed to a semiconductor device comprising an anti-fuse portion and a cell portion other than the anti-fuse portion, each of which includes a MOSFET structure, wherein when programming the anti-fuse portion, a voltage is applied to a gate electrode on an inversion side, whereby a gate insulating film of the anti-fuse portion is broken down.

A third aspect of the present invention is directed to a method of manufacturing an anti-fuse element comprising an anti-fuse portion and a memory cell portion other than the anti-fuse portion, each of which includes a MOSFET type gate capacitor, the method comprising: forming an element isolation region in a semiconductor substrate to prepare first and second element forming regions in which the anti-fuse portion and the memory cell portion are formed, respectively; forming a sacrifice oxide film in at least the first and second element forming regions on the semiconductor substrate, thereafter implanting impurity ions therein to form a well and a channel each having a conductive type different from that of the semiconductor substrate in the semiconductor substrate, removing the sacrifice oxide film therefrom, and then forming a gate insulating film on the semiconductor substrate; depositing a gate electrode semiconductor layer which is to become a gate electrode on the gate oxide film, and forming a mask having a pattern to cover the whole of the first element forming region in which the anti-fuse portion is formed on the gate electrode semiconductor layer and not to cover a region which becomes a memory cell portion gate electrode in the second element forming region in which the memory cell portion is formed; implanting impurity ions in the gate electrode semiconductor layer via the mask to introduce the impurities into the memory cell portion gate electrode forming region, and then removing the mask therefrom; forming a resist pattern in accordance with shapes of an anti-fuse gate electrode and a memory cell portion gate electrode on the gate electrode semiconductor layer, and etching the pattern to form the respective gate electrodes; forming a second gate insulating film in such a manner as to cover the gate insulating film on the semiconductor substrate and the whole of the gate electrodes, and thereafter removing a region other than at least a channel region to form side walls which cover the gate electrodes; forming a resist pattern in a portion other than the gate electrodes and the side walls on the gate insulating film, and implanting source/drain ions therein to form source/drain diffusion layers in the element forming regions of the semiconductor substrate; and performing a setting operation so that a depletion ratio of the gate electrode of the anti-fuse portion is different from that of the gate electrode of the memory cell portion, and the depletion ratio of the gate electrode of the anti-fuse portion is lower than that of the gate electrode of the memory cell portion.

DESCRIPTION OF PREFERRED EMBODIMENTS

Embodiments of a semiconductor device including an anti-fuse element and a memory cell and a method of manufacturing the element according to the present invention will be described hereinafter with reference to the accompanying drawings.

First Embodiment

A semiconductor device including an anti-fuse element and memory cell according to a first embodiment of the present invention will be described in detail with reference to FIGS. 1 to 3. It is to be noted that the first embodiment will be described in such a manner that the present invention can be easily understood, and does not limit the present invention.

Figure 1:
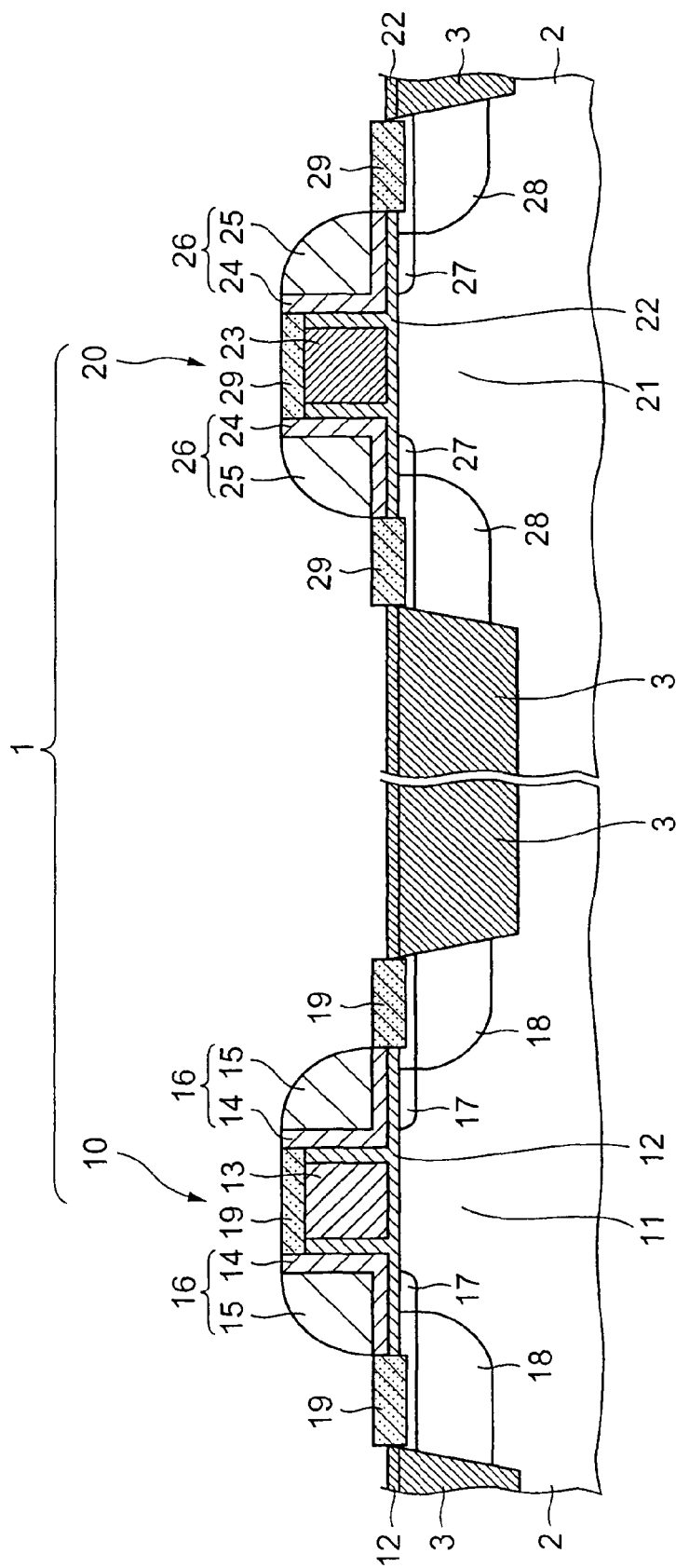
FIG. 1 is a sectional view showing a schematic constitution of a semiconductor device including an anti-fuse element and a memory cell according to a first embodiment of the present invention.
Figures 2A, 2B:
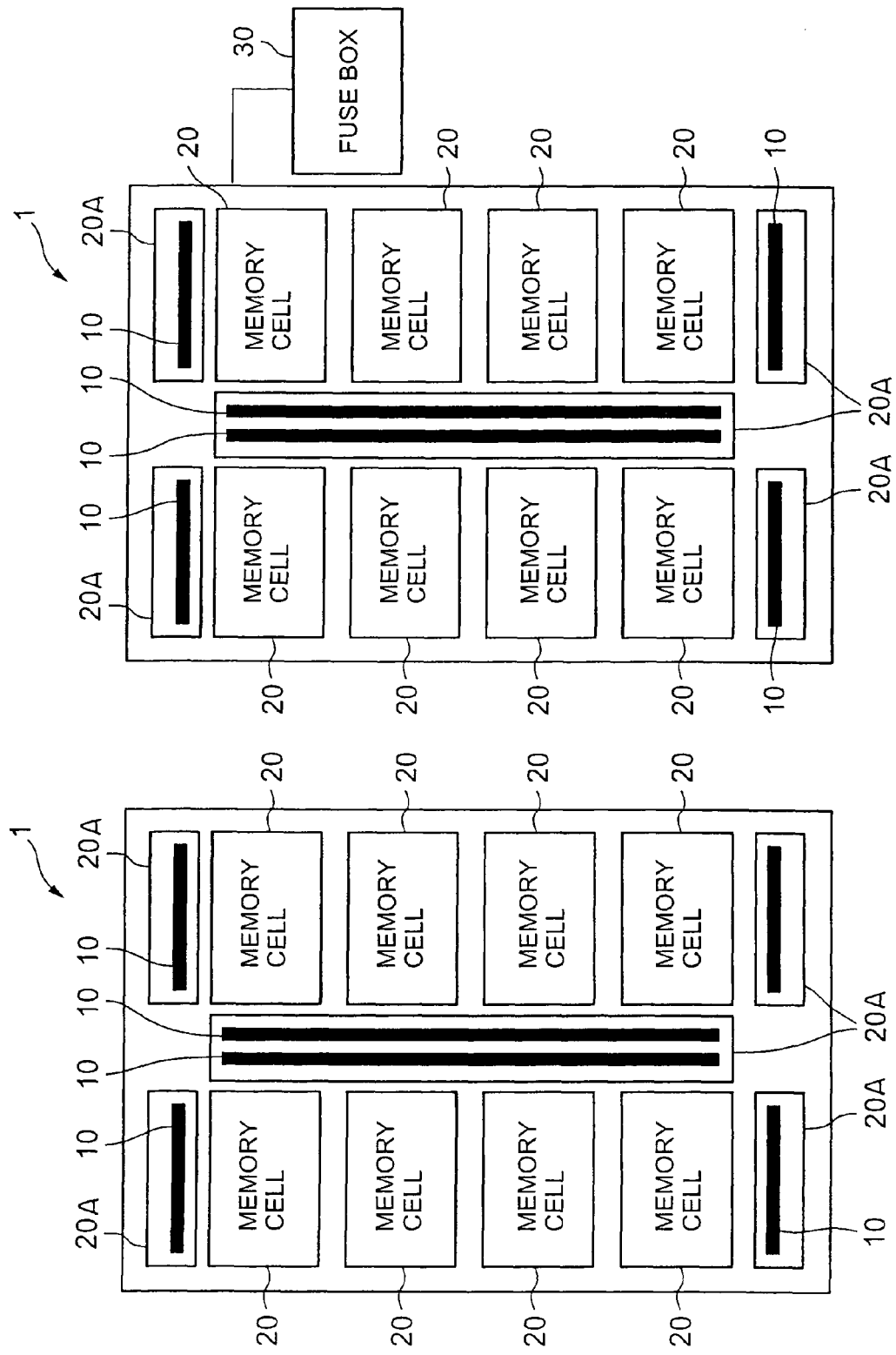
FIG. 2 is a plan view showing a planar arrangement of the semiconductor device including the anti-fuse element and memory cell according to the first embodiment.

FIG. 1 is a sectional view showing a constitution of a semiconductor device including an anti-fuse element and memory cell according to a first embodiment of the present invention, and FIGS. 2(a) (b) are plan views showing planar arrangements of the semiconductor device. A semiconductor device 1 has anti-fuse portions 20A including anti-fuse lines 10 and memory cell portions 20. In the arrangement of the anti-fuse portions 20A and the cell portions 20, as in one example of a general arrangement shown in FIG. 2(a), a plurality of memory cell portions 20 and a plurality of anti-fuse portions 20A are arranged in predetermined positions of the semiconductor device 1, and portions other than the memory cell portions 20 are arranged. For example, anti-fuse portions 20A including anti-fuse lines 10 are arranged, for example, in peripheral portions of the semiconductor device 1, and portions between the memory cell portions 20 on opposite sides. In other words, the memory cell portions 20 shown in FIGS. 2(a) (b) are circuit blocks including memory cells such as SRAM, and the anti-fuse portions 20A including the anti-fuse lines 10 does not generally include memory cells.

In the semiconductor element 1 according to the first embodiment, a peripheral circuit around the anti-fuse portion 10 is also manufactured by a semiconductor circuit constitution similar to that of the memory cell portion 20. As one arrangement of the semiconductor device 1, as shown in FIG. 2(b), the anti-fuse line 10 is disposed in a part of the peripheral circuit, and a fuse box 30 is further disposed in another portion. For example, a constitution using the anti-fuse lines 10 and the fuse box 30 is called a hybrid type.

Turning back to FIG. 1, a basic constitution of the semiconductor device including a memory cell and anti-fuse element of the first embodiment will be described with reference to the sectional view. The semiconductor device 1 comprises gate insulating films 12, 22 formed on a semiconductor substrate 2, and MOSFET type gate capacitors including gate electrodes 11, 21 formed on the gate insulating films 12, 22. In this constitution, a gate electrode depletion ratio of the anti-fuse portion in the gate electrode 11 of the anti-fuse portion 10 is different from that of the cell portion in the gate electrode 21 of the memory cell portion 20 including the peripheral circuit other than the anti-fuse portion 10. Together with this constitution, the gate electrode depletion ratio of the anti-fuse portion is set to be always lower than that of the memory cell portion. In the display of FIG. 1, it is shown by roughness and fineness of hatching of a section that the depletion ratio of a gate electrode 13 of the anti-fuse portion 10 is different from that of a gate electrode 23 of the memory cell portion 20.

Figure 3:
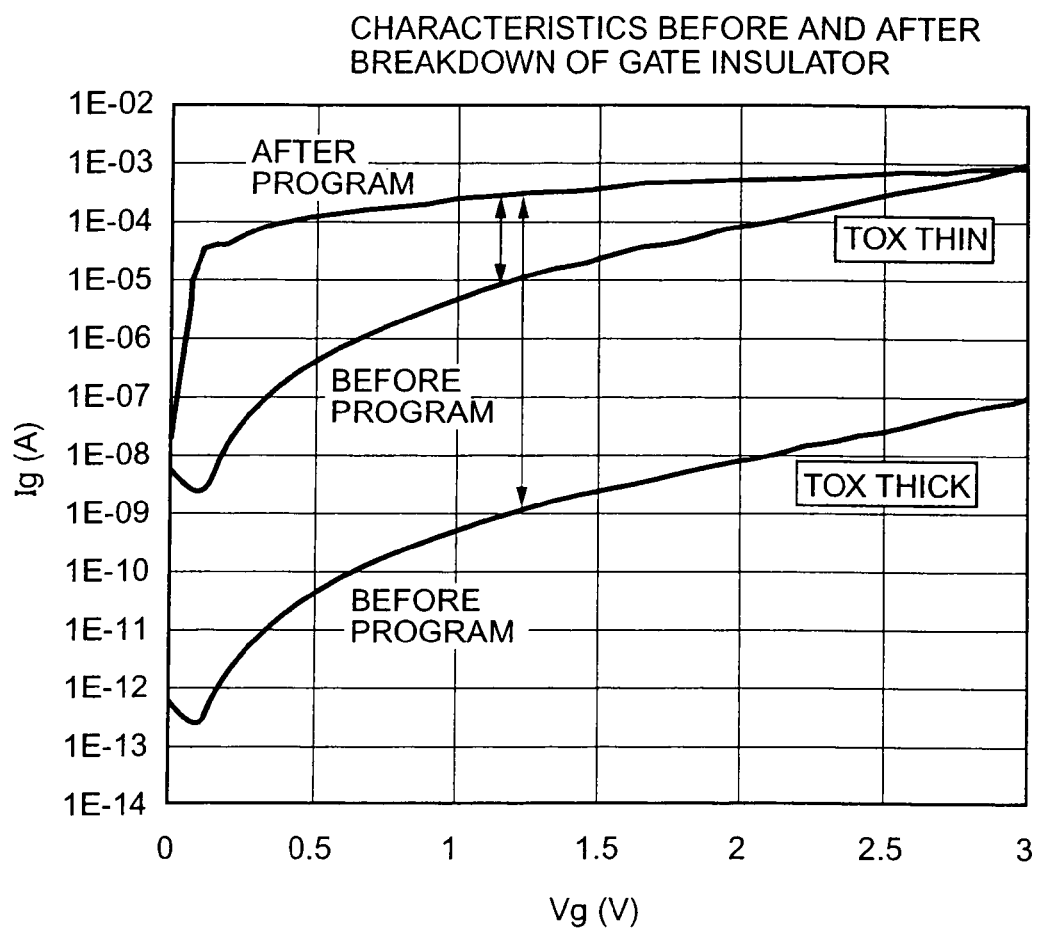
FIG. 3 is a characteristic drawing showing characteristics before/after breakdown of a gate insulating film of an anti-fuse portion in the anti-fuse element according to the first embodiment in accordance with comparison with conventional characteristics.

In a case where the depletion ratio in the gate insulating film of the anti-fuse portion 10 in the semiconductor device 1 is high, there has been a problem that as described above, a value of Ig(A) is high before programming, and a difference from a value after the programming cannot be sufficiently secured as shown in the upper side of FIG. 3. On the other hand, in the constitution of the semiconductor device 1 including the anti-fuse element of the first embodiment, as shown lower-side characteristic of FIG. 3, when the depletion ratio of the gate electrode of the anti-fuse portion 10 before programming is secured to be sufficiently low, a difference of Ig(A) before/after the programming is sufficiently secured.

A constitution in which the gate electrode depletion ratio of the anti-fuse portion is varied from that of the cell portion is realized, when concentration of impurity ions implanted in the gate electrode 13 of the anti-fuse portion 10 is set to be smaller than that of impurity ions implanted in the gate electrode 23 of the memory cell portion 20 including the peripheral circuit. The concentration of the impurity ions implanted in the electrode of the anti-fuse portion 10 may be set to differ in a height direction. For example, the impurity ion concentration may be set to become lower with approach to a boundary face between the gate electrodes 13, 23 and a gate oxide film 5.

Other constitution of the semiconductor element 1 shown in FIG. 1 will be described. The semiconductor substrate 2 is provided with first and second element forming regions 11 and 21, respectively, for each of the anti-fuse portion 10 and the memory cell portion 20 other than the anti-fuse portion by an element isolation region 3, and the gate electrodes 13, 23 are formed in the first and second element forming regions 11 and 21 via the gate insulating films 12, 22. Insulation side wall portions formed integrally along opposite sides of the gate electrodes 13, 23 are arranged in a height direction from a flat portion of the boundary face between the gate insulating films 12, 22 and the substrate 2, and L-shaped second insulation films 14, 24 as a first side insulation film are formed on opposite sides along side wall portions from the flat portions of the gate insulating film 12, 22. Insulation films 15, 25 as a second side insulation film formed of silicon oxide films are formed on the opposite sides of the second insulation films 14, 24, and double insulation films 16, 26 constituted of the insulation films 14, 15 and 24, 25 as the first and second side insulation films are formed. Moreover, metal films of cobalt (Co), titanium (Ti) and the like are formed on the surfaces of source/drain regions 18 and gate electrodes 13, 23 by sputtering and then a thermal treatment. Accordingly, metal silicide films 19, 29 formed by reaction with silicon are selectively attached.

Second Embodiment

It has been described that the semiconductor device including a memory cell and anti-fuse element according to the first embodiment is characterized in the constitution in which the depletion ratios of the gate electrodes 11, 21 of the anti-fuse portion 10 and the memory cell portion 20 other than the anti-fuse portion are varied, respectively. However, in a case where it is difficult to form a sufficient difference of the depletion ratio between gate electrodes 11, 21, a voltage is applied to the gate electrode 11 on an inversion side to break down a gate oxide film 5 of an anti-fuse portion 10 in programming the anti-fuse portion 10 in a semiconductor device comprising the anti-fuse portions 10 each comprising a MOSFET type gate capacitor, and the memory cell portions 20 including peripheral circuits. Accordingly, the anti-fuse portions 10 can be securely programmed. Even the semiconductor device including the memory cell and anti-fuse element according to this second basic constitution (second embodiment) can achieve a desired present-invention object to prevent a leak current at a usual time while securely breaking down the gate insulating film of the anti-fuse portion only at a programming time.

An impurity concentration of a boundary face between a gate insulating film 12 and a gate electrode 13 in the anti-fuse portion 10 of the semiconductor element 1 constituted as described above is preferably 3E20 atom/cm$^3$ (i.e., $3 \times 10^{20}$) or less. It is to be noted that a lower limit of the impurity concentration is 0, and in this case any impurity is not implanted. In this case, the gate electrode 13 is an N-type semiconductor, and typical examples of impurities to be implanted in this N+ gate electrode include arsenic (As) and phosphorous (P).

Definition of a concentration difference of impurities in the surface and interface of the gate electrode 13 by the above-described numeric value is an illustration only. As a constitution of the second embodiment, the concentration in the vicinity of the interface is low with respect to that in the surface of the gate electrode 13, and the concentration is lowest in the interface. According to experiment data, it has been seen that impurity distribution largely changes with a thermal step, and the impurity concentration of the surface increases to about 1.5 times to 5 times as compared with that of the interface.

It is to be noted that the impurity concentration of a MOSFET portion of the cell portion 20 is set to be higher than 3E20 atom/cm$^3$ which is the impurity concentration of the boundary face of the anti-fuse portion 10, and the impurity concentration of the gate electrode 23 is preferably 5E20 atom/cm$^3$ (i.e., $5 \times 10^{20}$) or more in the N+ type. The concentration distributions of the electrode surface and interface in the gate electrode 23 have the same relation as those in the gate electrode 13.

It is to be noted that in a case where the gate electrodes of the anti-fuse portion 10 and memory cell portion 20 comprise P-type semiconductors, boron (B) is implanted as impurities in P+ gates which are ionic species to thereby form the gate electrodes. The impurity concentration of the interface between the gate electrode 13 and the gate insulating film 12 of the anti-fuse portion 10 is preferably 1E20 atom/cm$^3$ (i.e., $1 \times 10^{20}$) or less. It is to be noted that the lower limit is 0 because there is also a case where any impurity is not implanted in the same manner as in the N+ gate. The concentration distributions of the electrode surface and interface are similar to those of the N+ gate.

Moreover, the impurity concentration of the interface between the gate electrode 23 and the gate insulating film 22 in the cell portion 20 is set to be larger than 1E20 atom/cm$^3$ which is a concentration of the interface of the gate electrode 13 of the anti-fuse portion 10. The impurity concentration of the gate electrode 23 of the cell portion 20 is preferably 2E20 atom/cm$^3$ (i.e., $2 \times 10^{20}$) or more in the P+ type. The concentration distributions of the electrode surface and interface in the gate electrode 23 have the same relation as that in the gate electrode 13.

Third Embodiment

It has been described that the semiconductor device including a memory cell and anti-fuse element according to the first embodiment is characterized in the constitution in which the depletion ratios of the gate electrodes 11, 21 of the anti-fuse portion 10, and the memory cell portion 20 including a circuit constitution other than that of the anti-fuse portion are varied, respectively and in that the volume to be applied at the programming time is controlled on the inversion side. However, the present invention is not limited to the only semiconductor device 1 having this constitution, and is also characterized in a method of manufacturing the anti-fuse element constituted as in the first embodiment. A method of manufacturing a semiconductor device including a memory cell and anti-fuse element according to a third embodiment which is a third basic constitution of the present invention will be described in detail with reference to FIGS. 4(*a*) to (*h*).

Figure 4:
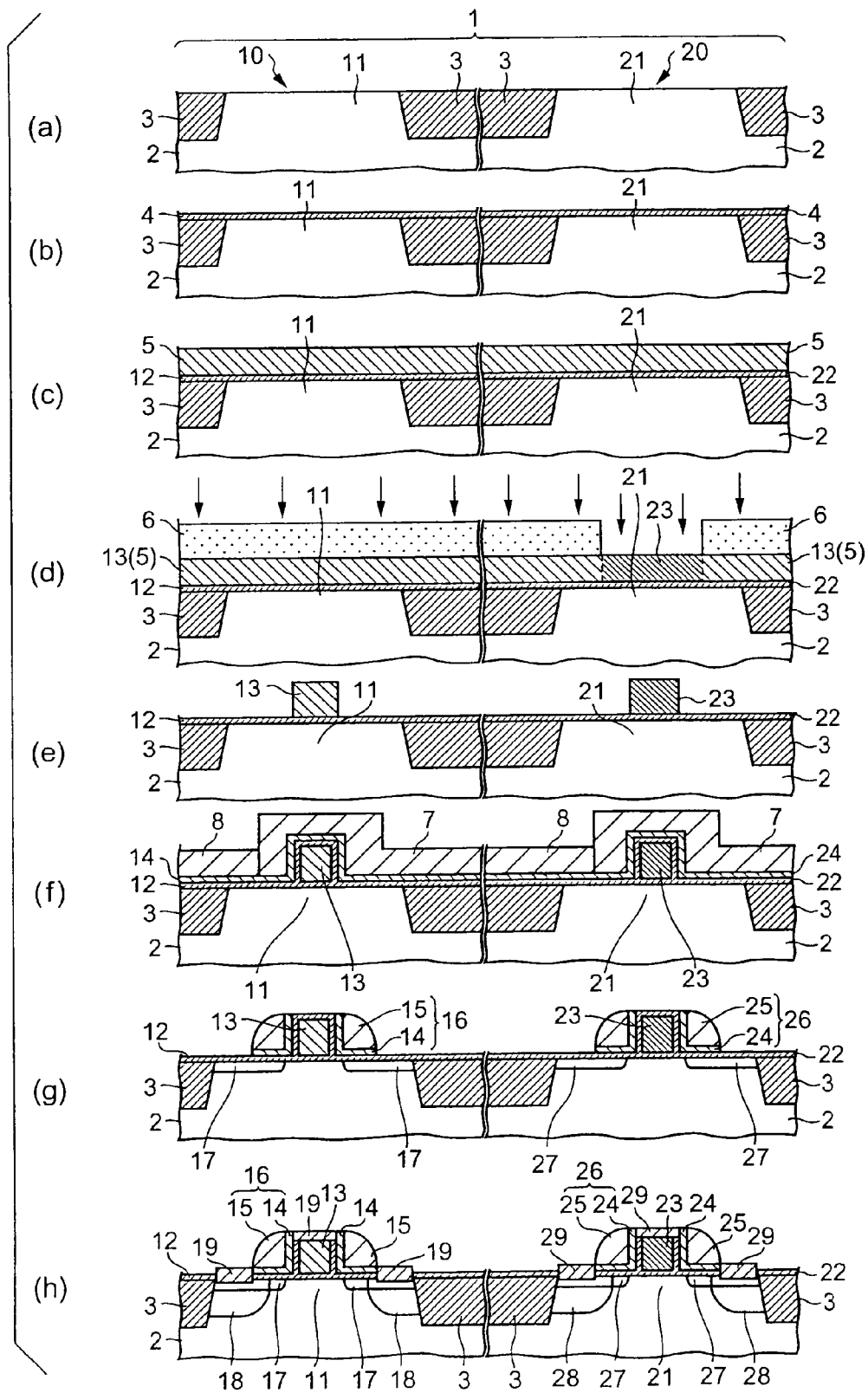
FIG. 4 is a flowchart showing a method of manufacturing the semiconductor device including the anti-fuse element and memory cell according to third and fourth embodiments of the present invention.

FIGS. 4(*a*) to (*h*) show steps of the method of manufacturing the semiconductor device including a memory cell and anti-fuse element, in which an anti-fuse portion and a cell portion comprises a MOSFET type gate capacitor, respectively. As shown in FIG. 4(*a*), element isolation regions 3 are formed in a semiconductor substrate 2, and first and second element forming regions 11, 21 for forming an anti-fuse portion 10 and a cell portion 20 other than the anti-fuse portion 10, respectively, are formed. Next, as shown in FIG. 4(*b*), after forming a sacrifice oxide film 4 on the semiconductor substrate 2, impurity ions are implanted in the semiconductor substrate 2 to form well and channel of a conductive type different from that of the semiconductor substrate 2. After removing the sacrifice oxide film 4, gate insulating films 12, 22 are formed on at least the first and second element forming regions 11, 21 in the semiconductor substrate 2. Thereafter, as shown in FIG. 4(*c*), a polycrystalline silicon film 5 is deposited as a gate electrode semiconductor layer constituting gate electrodes 13, 23 on the gate insulating films 12, 22.

Next, as shown in FIG. 4(*d*), a resist 6 is formed on the polycrystalline silicon film 5. With respect to this resist 6, a mask having a pattern in which portions forming the gate electrodes in the anti-fuse portion 10 and the cell portion 20 not covered is formed on the polycrystalline silicon film 5 which is the semiconductor layer for the gate electrodes. After forming the mask, as shown by arrows in FIG. 4(*d*), impurity ions are implanted in the semiconductor layer for the gate electrodes from an upper direction via the mask. At this time, the impurity ion concentration of a polycrystalline silicon film 13 (5) on the side of the anti-fuse portion 10 in which the resist 6 is disposed is different from that of a polycrystalline silicon film 23 from which the resist 6 is removed and which is a part of the cell portion 20 other than the anti-fuse portion

10. The impurity ion concentration of the gate electrode 13 on the side of the anti-fuse portion is smaller than that of the gate electrode 23 on the side of the cell portion.

Next, as shown in FIG. 4(*e*), a resist pattern in which the gate electrode semiconductor layer is formed in accordance with shapes of the gate electrode 13 for an anti-fuse and the gate electrode 23 for the cell portion is formed, etching is performed, and the gate electrode 13 for the anti-fuse, and the gate electrode 23 for the cell portion are formed, respectively.

Next, after forming second gate insulating films 14, 24 in such a manner as to cover the gate insulating films 12, 22 on the semiconductor substrate 2 and the whole of the gate electrode, as shown in FIG. 4(*f*), at least a region other than the channel region is removed to thereby form side walls 15, 26 which cover the gate electrodes 13, 23, and double side walls 16, 26 constituted of the gate insulating films 12, 14 and 22, 24 are formed with respect to the respective gate electrodes 13, 23. Thereafter, a resist pattern (not shown) is formed in a portion other than the gate electrodes 13, 23 on the gate insulating film and the side walls to thereby implant source/drain ions. Shallow extension layers 17, 27 and deep source/drain diffusion layers 18, 28 are formed in element forming regions 11, 21 of the semiconductor substrate 2. Then, a semiconductor device 1 is manufactured in such a manner that depletion ratios of the gate electrodes 13, 23 of the anti-fuse portion 10 and the cell portion 20 other than the anti-fuse portion are different, and the depletion ratio of the anti-fuse portion gate electrode 13 is set in such a manner as to be always lower than that of the cell portion gate electrode 23.

Fourth Embodiment

Next, a method of manufacturing a semiconductor device including an anti-fuse element according to a fourth embodiment will be described as a detailed manufacturing method of the above-described third embodiment. Since the steps of the third embodiment are constituted slightly in detail in the fourth embodiment, the embodiment will be described with reference to FIGS. 4(*a*) to (*h*) again.

First, as shown in FIG. 4(*a*), an element isolation region 3 and element forming regions 11, 21 are formed in a silicon substrate 2. In the fourth embodiment, the element isolation region 11 is formed using a shallow trench isolation (STI) technique in which a shallow trench is worked, and a silicon oxide film is buried in the shallow trench, but the region may be formed by a process of local oxidation of silicon (LOCOS).

Thereafter, as shown in FIG. 4(*b*), a sacrifice oxide film 4 is formed in the element forming regions 11, 21, ions are implanted through the sacrifice oxide film 4, and well and channel (not shown) of a type different from that of the substrate 2 are formed in the element forming region 11 for the anti-fuse portion 10. It is to be noted that since complementary metal oxide semiconductor type elements are mounted on other peripheral circuits and cell portions, the wells and channels of types which are different from and the same as the type of the substrate 2 exist in a mixed manner.

Next, after removing the sacrifice oxide film 4, silicon nitride films (gate insulating films) 12, 22 each having a thickness of about 0.8 nm are formed as the respective gate insulating films by a thermal oxidation process or a chemical vapor deposition process (hereinafter referred to as the CVD process), and a polysilicon film 5 is deposited on the films [FIG. 4(*c*)]. Here, a material of a gate electrode is not limited to a single-layer polysilicon film, and may be single-layer α-Si, or have a stacked structure such as α-Si/poly-Si or SiGe/poly-Si.

Subsequently, a resist pattern 6 is formed by a lithography process. At this time, a region in which the gate electrode of the anti-fuse portion 10 is to be formed is covered with the resist 6, and the resist 6 is removed from a region in which a peripheral circuit or the gate electrode of the cell portion 20 are to be formed.

Thereafter, the resist 6 is used as a mask to implant ions, and, as shown in FIG. 4(*d*), impurities are introduced into the region in which the peripheral circuit or the gate electrode 23 of the cell portion 20 is to be formed. Next, after forming a resist pattern (not shown) by a lithography process, the polysilicon film 5 is etched by reactive ion etching (RIE), and the gate electrodes 13, 23 are formed as shown in FIG. 4(*e*).

Next, after performing post-oxidation by about 0.5 nm to 2 nm for a purpose of enhancing reliability of the gate insulating film, ion implantation and annealing are performed, and shallow and low-concentration source/drain diffusion layers (extension) 17, 27 are formed in the anti-fuse portion 10 and the cell portion 20. Furthermore, a silicon oxide film 7 is deposited in about 5 to 20 nm by the CVD process, and substantially a silicon nitride film 8 is deposited in a thickness of about 10 nm to 80 nm by the same CVD process [FIG. 4(*f*)].

Thereafter, the silicon substrate 2 is used as a stopper to thereby perform RIE with respect to the silicon nitride film 8 and silicon oxide film 7. As shown in FIG. 4(*g*), a gate double side wall 16 is formed in a side portion of the gate electrode 13, and a double side wall 26 is formed in a side portion of the gate electrode 23. It is to be noted that the structure of the side wall is not limited to the double structure, and may be a single-layer film, or a multiple side-wall film of three or more layers.

Next, patterning is performed in a resist (not shown), ions are implanted, and deep and high-concentration source/drain diffusion layers 18, 28 are formed. Thereafter, in order to activate the implanted impurities, rapid thermal annealing (RTA) or spike annealing is performed. During the resist patterning, the region of the gate electrode 13 of the anti-fuse portion 10 is covered, and source/drain ions may not be implanted in the gate electrode 13.

Furthermore, oxide films on the gate electrodes 13, 23 and the diffusion layers 18, 28 are removed by wet etching, and, as shown in FIG. 4(*h*), metal silicide films 19, 29 are selectively formed on the surface of the source/drain region and the surfaces of the gate electrodes 13, 23. The metal silicide films 19, 29 are formed by reaction with silicon, when metal films of Co, Ti and the like are formed by sputtering, and thermal treatment is performed. Thereafter, non-reacted metal films are removed, and metal silicide films 19, 29 are selectively attached.

Thereafter, although not shown, an interlayer insulation film is deposited, contact holes are formed in the interlayer insulation film, and wires are formed following usual steps. A MOSFET type gate capacitor is obtained as described above.

As described above, according to the fourth embodiment of the present invention, since the film thickness of the electric gate insulating film 12 of the anti-fuse portion 10 before the programming can be increased without increasing steps, a current difference before/after the programming is easily secured. As a result, there can be provided an anti-fuse element having satisfactory programming characteristic and high reliability.

Fifth Embodiment

It has been described in the fourth embodiment that ion species are introduced in the source/drain (S/D) ion implantation step after working the gate without implanting any ion in the gate forming portion of the anti-fuse portion 10 before working the gate. The present invention is not limited to this manufacturing method, and a semiconductor device including a memory cell and anti-fuse element may be manufactured by a method in which ions are implanted before working the gate, and ion species are not introduced in the source/drain ion implantation step as in a method of manufacturing the semiconductor device according to a fifth embodiment.

In the method of manufacturing the semiconductor device such as an anti-fuse element according to the fifth embodiment, it will be described that ions are implanted in the gate forming portion of an anti-fuse element 10 before working the gate, and ion species are not introduced in the source/drain (S/D) ion implantation step after working the gate. A method of manufacturing the anti-fuse element according to the fifth embodiment of the present invention will be described in detail with reference to FIGS. 5(a) to (h) corresponding to FIGS. 4(a) to (h). It is to be noted that the fifth embodiment is described in such a manner that the present invention can be easily understood, and the present embodiment does not limit the present invention. In FIGS. 5(a) to (h), the same constituting factors as those of FIG. 4 or the corresponding factors are denoted with the same reference numerals, and redundant description is omitted.

Figure 5:
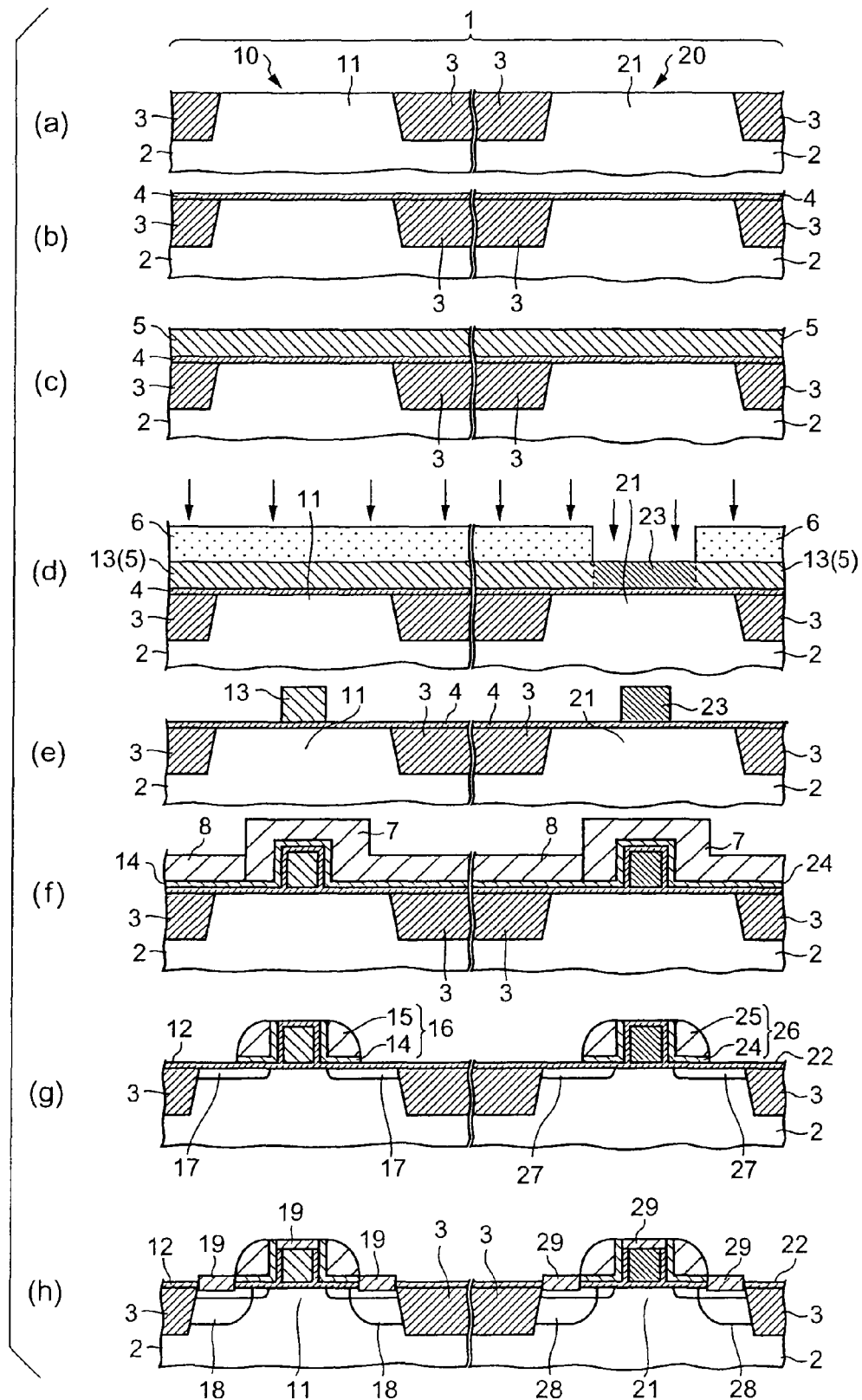
FIG. 5 is a flowchart showing a method of manufacturing the semiconductor device including the anti-fuse element and memory cell according to a fifth embodiment of the present invention.

As shown in FIG. 5(a), element isolation regions 3 and element forming regions 11, 21 are formed in a silicon substrate 2. In the fifth embodiment, in the same manner as in the fourth embodiment, the element isolation regions 11, 21 are formed using an STI technique in which shallow trenches are worked, and silicon oxide films are buried in the trenches, but the regions may be formed by a LOCOS process as described above.

Thereafter, as shown in FIG. 5(b), a sacrifice oxide film 4 is formed in the element forming regions 11, 21, ions are implanted through the sacrifice oxide film 4, and well and channel (not shown) are formed into a type different from that of the substrate 2 in a region forming the anti-fuse portion 10. It is to be noted that since a CMOS type element is mounted, wells and channels of types which are different from and the same as those of the substrate 2 exist in a mixed manner in another peripheral circuit or a cell portion 20.

Next, after removing the sacrifice oxide film 4, gate insulating films 12, 22 constituted of silicon oxide films or nitride films each having a thickness of about 0.8 nm are formed by a thermal oxidation process or a CVD process, and a polysilicon film 5 is deposited on the insulation films [FIG. 5(c)].

Subsequently, a resist pattern 7 is formed by a lithography process, the resist 7 is used as a mask to thereby implant ions, and impurities are introduced in a region in which the gate electrode of the anti-fuse portion 10 is to be formed or in which the peripheral circuit and the gate electrode of the cell portion 20 are to be formed [FIG. 5(d)].

Thereafter, first silicon nitride films 14, 24 are deposited on the whole surface. After forming a resist pattern (not shown) by a lithography process, the first silicon nitride film and the polysilicon film 5 are etched by an RIE process to thereby form gate electrodes 13, 23 as shown in FIG. 5(e).

Next, after performing post-oxidation by about 0.5 nm to 2 nm for a purpose of enhancing reliability of the gate insulating film, ion implantation and annealing are performed, and shallow and low-concentration source/drain diffusion layers (extension) 17, 27 are formed.

Furthermore, a silicon oxide film 7 is deposited in about 5 to 20 nm by a CVD process, and subsequently a second silicon nitride film 8 is deposited in a thickness of about 10 nm to 80 nm by the CVD process [FIG. 5(f)].

Thereafter, the silicon substrate 2 is used as a stopper to thereby perform RIE with respect to second silicon nitride films 14, 24 and silicon oxide films 15, 25, and gate double side walls 16, 26 are formed in side portions of gate electrodes 13, 23 [FIG. 5(g)]. It is to be noted that the structure of the side wall is not limited to the double structure, and may be a single-layer film or a multiple side wall film.

Here, wet etching is performed over the whole surface, a silicon (Si) substrate surface is exposed in source/drain (S/D) forming regions 11, 21, and Si is epitaxially (Epi) grown into about 20 nm to 50 nm on the Si substrate. At this time, since the gate electrodes 13, 23 are covered with the first silicon nitride films, Epi growth does not occur.

Next, a region where the anti-fuse portion 10 is to be formed is covered with the resist, the other peripheral circuit portion or the cell portion is patterned (not shown) in such a manner that the resist is eliminated, and the second silicon nitride film 8 of the peripheral circuit portion or the cell portion is removed with hot phosphate. Next, after removing the resist, ions are implanted, deep and high-concentration source/drain diffusion layers 18, 28 are formed, and RTA or spike annealing is performed in order to activate implanted impurities.

Here, since the first silicon nitride film 15 remains in the gate electrode of the anti-fuse portion, the implanted ions do not enter the gate electrode portion, and ion species are introduced into the peripheral circuit portion or the gate electrode of the cell portion only.

Furthermore, the oxide films on the gate electrodes 13, 23 and the diffusion layers 18, 28 are removed by wet etching, and metal silicide films 19, 29 are selectively formed on the surfaces of the source/drain region and gate electrodes 13, 23 [FIG. 5(h)]. The metal silicide films 19, 29 are formed by reaction with silicon, when metal films of Co, Ti and the like are formed by sputtering, and thermal treatment is performed. Thereafter, non-reacted metal films are removed, and metal silicide films 19, 29 are selectively attached.

It is to be noted that salicide is not formed on the gate electrode of an anti-fuse in the above-described process, but salicide may be attached onto the anti-fuse portion 10, when adding a wet etching step by hot phosphate before forming salicide to thereby remove the silicon nitride film on the gate electrode 13 of the anti-fuse 10.

Thereafter, although not shown, an interlayer insulation film is deposited, contact holes are formed in the interlayer insulation film, and wires are formed following usual steps. A MOSFET type gate capacitor can be obtained by the above-described steps.

It is to be noted that a most basic constitution of the present invention is characterized in that in the process of manufacturing the gate capacitors of the anti-fuse portion 10 and the other cell portion 20 of the semiconductor element 1, the impurity concentration of the gate electrode 13 of the anti-fuse portion 10 is set to be different from that of the gate electrode 23 of the cell portion 20, and especially the concentration of the gate electrode 13 of the anti-fuse portion 10 is set to be lower than that of the gate electrode 23 of the cell portion 20. Therefore, in a case where the gate insulating films 12, 22 are formed through a plurality of types of gate oxide film processes, as shown in FIG. 3, the gate insulating film may be selectively formed in order to secure the film thickness of the gate insulating film, impurity concentration, and distribution characteristic in such a manner that a margin of the anti-fuse portion 10 before/after the programming is maximized (on-off ratio can be sufficiently secured).

As described above, according to the present invention, electric resistance properties of the gate insulating film of the anti-fuse portion before the programming can be strengthened without increasing steps. Therefore, a current difference before/after the programming is easily secured. As a result, there can be provided a semiconductor device with a memory cell and anti-fuse element, having satisfactory programming characteristic and high reliability.

What is claimed is:

1. A semiconductor device comprising:
   a semiconductor substrate;
   a plurality of first MOSFET elements formed on the semiconductor substrate, in which the first MOSFET elements each comprise a first gate insulating film provided on a surface of the semiconductor substrate, and a first gate electrode provided on the first gate insulating film; and
   a plurality of second MOSFET elements formed on the semiconductor substrate and provided in the vicinity of the plurality of first MOSFET elements, in which the second MOSFET elements each comprise a second gate insulating film provided on the surface of the semiconductor substrate, and a second gate electrode provided on the second gate insulating film,
   wherein a depletion ratio in the second gate electrode is lower than a depletion ratio in the first gate electrode.

2. The semiconductor device according to claim 1, wherein metal silicide films are attached on upper surfaces of the first and second gate electrodes, respectively.

3. The semiconductor device according to claim 2, wherein the metal silicide films are formed by metal including cobalt (Co), titanium (Ti) and nickel (Ni).

4. The semiconductor device according to claim 1, wherein the first and second gate electrodes comprise side walls each surrounding around the first and second gate electrodes, respectively.

5. The semiconductor device according to claim 1, wherein the first and second MOSFET elements comprise first and second source/drain regions, respectively.

6. The semiconductor device according to claim 5, wherein the first and second MOSFET elements further comprise first and second source/drain diffusion layers, respectively.

7. The semiconductor device according to claim 6, wherein the first and second source/drain diffusion layers are provided on the semiconductor substrate and in the vicinity of the first and second gate electrodes, respectively.

8. The semiconductor device according to claim 1, wherein the first MOSFET element constitutes an SRAM, and the second MOSFET element constitutes an anti-fuse element.

9. The semiconductor device according to claim 1, wherein at least one of the plurality of the first MOSFET elements is provided in the vicinity of at least one of the plurality of the second MOSFET elements through an element isolation region.

10. A semiconductor device comprising:
    a semiconductor substrate;
    a plurality of first MOSFET elements formed on the semiconductor substrate, in which the first MOSFET elements each comprise a first gate insulating film provided on a surface of the semiconductor substrate, and a first gate electrode provided on the first gate insulating film; and
    a plurality of second MOSFET elements formed on the semiconductor substrate and provided in the vicinity of the plurality of first MOSFET elements, in which the second MOSFET elements each comprise a second gate insulating film provided on the surface of the semiconductor substrate, and a second gate electrode provided on the second gate insulating film,
    wherein an impurity concentration of the second gate electrode is lower than an impurity concentration of the first gate electrode.

11. The semiconductor device according to claim 10, wherein metal silicide films are attached on upper surfaces of the first and second gate electrodes, respectively.

12. The semiconductor device according to claim 11, wherein the metal silicide films are formed by metal including cobalt (Co), titanium (Ti) and nickel (Ni).

13. The semiconductor device according to claim 10, wherein the first and second gate electrodes comprise side walls each surrounding around the first and second gate electrodes, respectively.

14. The semiconductor device according to claim 10, wherein the first and second MOSFET elements comprise source/drain regions, respectively.

15. The semiconductor device according to claim 14, wherein the first and second MOSFET elements further comprise source/drain diffusion layers, respectively.

16. The semiconductor device according to claim 15, wherein the first and second source/drain diffusion layers are provided on the semiconductor substrate and in the vicinity of the first and second gate electrodes, respectively.

17. The semiconductor device according to claim 10, wherein the first MOSFET element constitutes an SRAM, and the second MOSFET element constitutes an anti-fuse element.

18. The semiconductor device according to claim 10, wherein at least one of the plurality of the first MOSFET elements is provided in the vicinity of at least one of the plurality of the second MOSFET elements through an element isolation region.

19. The semiconductor device according to claim 10, wherein impurities to be implanted in the second gate electrodes include arsenic (As) or phosphorous (P).

20. The semiconductor device according to claim 10, wherein impurities to be implanted in the second gate electrodes include boron (B).

* * * * *